(12) United States Patent
Lestra et al.

(10) Patent No.: US 6,253,009 B1
(45) Date of Patent: Jun. 26, 2001

(54) SEMICONDUCTOR OPTICAL COMPONENT COMPRISING A SPOT-SIZE CONVERTER

(75) Inventors: Alexis Lestra; Veronique Colson, both of Paris (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/447,296

(22) Filed: Nov. 23, 1999

(30) Foreign Application Priority Data

Nov. 24, 1998 (FR) .................................................. 98 14804

(51) Int. Cl.[7] .................................................. G02B 6/12
(52) U.S. Cl. .............................. 385/50; 385/14; 385/131; 385/132; 372/50
(58) Field of Search .......................... 372/43, 50; 385/50, 385/131, 132, 14

(56) References Cited

U.S. PATENT DOCUMENTS

| 5,703,974 | 12/1997 | Sasaki et al. . |
| 5,720,893 | 2/1998 | Ben-Michael et al. . |
| 5,917,972 | * 6/1999 | Davies . |
| 6,075,801 | * 6/2000 | Tamanuki et al. . |

FOREIGN PATENT DOCUMENTS 8-236862   9/1996   (EP) .

OTHER PUBLICATIONS

Kawano, K. et al.: "Comparison of Coupling Characteristics for Several Spotsize–Converter–Integrated Laser Diodes in the 1.3–MUM Wavelength Region" IEEE Photonics Technology Letters, vol. 9, No. 4, Apr. 1, 1997, pp. 428–430, XP000690456 ISSN: 1041–1135.

Lestra, A. et al.: "Monolithic Integration of Spot–Size Converters with 1.3–MUM Lasers and 1.55–MUM Polarization Insensitive Semiconductor Optical Amplifiers" IEEE Journal of Selected Topics in Quantum Electronics, vol. 3, No. 6, Dec. 1, 1997, pp. 1429–1440, XP000741462 ISSN: 1077–260X.

Vusirikala, V. et al.: "1.55–MUM INGAASP–INP Laser Arrays with Integrated–Mode Expanders Fabricated Using a Single Expitaxial Growth" IEEE Journal of Selected Topics in Quantum Electronics, vol. 3, No. 3, Dec. 1, 1997, pp. 1332–1343, XP000741453, ISSN: —1077–260X.

* cited by examiner

Primary Examiner—Hung N. Ngo
(74) Attorney, Agent, or Firm—Sughrue, Mion, Zinn, Macpeak & Seas, PLLC

(57) ABSTRACT

A semiconductor optical component, comprising a spot-size converter to deconfine the optical mode, comprises an active waveguide and a passive waveguide that are superimposed and buried in a sheathing layer. The component successively comprises a damped coupling section in which the width of the active waveguide tapers down and the width of the passive waveguide increases, and a mode expansion section comprising only the passive waveguide whose width tapers down.

10 Claims, 4 Drawing Sheets

SEMICONDUCTOR OPTICAL COMPONENT COMPRISING A SPOT-SIZE CONVERTER

BACKGROUND OF THE INVENTION

1. Field of the Invention

The invention relates to the field of semiconductor optical components used for optical transmission or optical digital data processing. It pertains especially to all optical components comprising active and passive waveguides buried in sheathing layers, for example components such as semiconductor lasers, semiconductor amplifiers or again modulators for example.

At present, it is being sought to reduce the cost of optical modules to the maximum. The greatest part of the cost here most usually arises from the joining of such components to optical fiber, as for example when it is necessary to couple optical modes of very different sizes. Thus, when a laser and a flat-end single-mode optical fiber are joined together, the optical mode of the laser, whose diameter is for example 2 $\mu$m, has to be coupled with the optical mode of the optical fiber whose diameter is far greater, for example in the range of 9 $\mu$m.

To enable the coupling of these optical modes of very different sizes, spot-size converters are made in order to increase the size of the mode at the output of the optical component and make its profile compatible with that of the mode guided in the optical fiber. However, this mode matching must be done while preserving the performance characteristics of the component. Thus, for a semiconductor laser for example, it must be possible to maintain its performance characteristics in terms of threshold current and efficiency. It is necessary indeed that, in the range of operating temperature (generally between –40° C. and +85° C.), the laser component should have a threshold current that is as low as possible and efficiency that is as high as possible. To thus preserve the performance characteristics of the component and not debase the current threshold and efficiency parameters, it appears to be preferable to carry out the expansion of the optical mode in a passive waveguide.

2. Description of the Prior Art

Several approaches have been envisaged to the deconfining of the optical mode of a component. A first method called butt coupling that enables the coupling of a passive waveguide with an active waveguide is very common today. The drawings of FIGS. 1A and 1B respectively show a top sectional view and a longitudinal sectional view of an integrated optical component during its manufacture by the butt coupling method.

This method consists, in a first stage, in achieving the growth, on a substrate 1, of a first layer 5 constituting the active waveguide formed for example by a quaternary material and in burying this layer in a sheathing layer 6 constituted for example by InP. These two layers 5 and 6 are then etched locally according to a standard etching method on a zone reserved for the integration of a passive type of waveguide. An epitaxial regrowth operation is performed to make this passive waveguide. For this purpose, a layer of quaternary material 2; capable of acting as the passive waveguide, is deposited on the substrate 1 in the zone that is locally etched beforehand. Then it is buried in a sheathing layer 3 made of InP for example. The structure of the active waveguide 5 is different from that of the passive waveguide 2. The coupling interface 7 between the two types of waveguides is called a butt joint. Furthermore, to enable the deconfining of the optical mode, the thickness of the passive guide 2 tapers evenly all along the passive section.

This method of manufacture is fully mastered at the present time. However, it requires an additional step of etching and epitaxy regrowth, thus giving rise to an increase in the cost price of the component. Furthermore, for aligning the active and passive guides, the alignment tolerance values remain low. Although the technique of butt coupling is well mastered, it is an extremely important step. This method is relatively complex to implement. It entails costs that are still high.

A second method, known as the method of selective epitaxial growth, has been considered. It is shown schematically in FIGS. 2A and 2B which respectively show a top sectional view and a longitudinal sectional view of an integrated optical component during its manufacture. In this method, the composition of a waveguide 7 is made to vary continuously, to make it gradually go from an active waveguide state 7A to a passive waveguide state 7B. The selective growth of the material constituting the waveguide 7 is achieved on a substrate 1 by the use of two dielectric masks, made of silica ($SiO_2$) or silicon nitride ($Si_3N_4$) for example, placed side by side. The species under growth do not get deposited on these masks, and a phenomenon of diffusion of species under growth is created. The shape of the masks is determined so that the phenomenon of diffusion of the species is pronounced to a greater or to a lesser extent, depending on the regions of the waveguide that are considered. Just as in the butt coupling method, the thickness of the waveguide in the passive section 7B tapers down in order to permit the deconfinement of the optical mode and therefore the increasing of its size. The optical guide 7A, 7B is furthermore buried in a sheathing layer 9.

This second method has the advantage of comprising only one epitaxial step. However, it cannot be used to optimize the two waveguides, namely the active waveguide 7A and the passive waveguide 7B, separately. This means that it necessitates compromises. Furthermore, this method does not enable a clear definition of the boundary between the two types of guides, active and passive, because the change in state is gradual. The fact of not being able to define this boundary enables penalties because it is difficult to know where to position the electrode necessary for the operation of the component. This electrode must indeed be positioned above the active guide to ensure efficient operation of the component. By contrast, if it covers a part of the passive guide, electrical leaks are created that penalize and degrade the threshold current and efficiency parameters.

A third approach that has been envisaged in order to obtain a spot-size converter integrated into an optical component is shown schematically in the top sectional view of FIG. 3. In this approach, an active waveguide 15 and a passive waveguide 12 are superimposed so as to create a damped vertical coupling zone SC, wherein the width of the active waveguide 15 tapers down gradually to deconfine the mode, and the width of the passive waveguide 15 increases very rapidly and then becomes constant throughout the length of this section. The two guides, namely the active guide 15 and the passive guide 12, are furthermore buried in a sheathing layer 17. In this case, the width of the coupling section SC must be sufficient to enable complete deconfinement of the optical mode in the entire active guide. This length is generally greater than 150 $\mu$m. Furthermore, as and when it gets deconfined, the optical mode transits through the passive guide 12. The passive guide has a constant width of about 4 $\mu$m and a very small thickness of about 50 nm to enable the deconfinement of the mode. For, an excessive thickness of this passive guide would prevent the deconfinement of the mode in the active guide. This is why the passive guide generally has a thickness of less than 100 nm.

The major drawback of this approach lies in the fact that the deconfinement of the mode is done entirely in the active guide. This leads to a deterioration of the performance characteristics of the component, especially its threshold current and its efficiency. Furthermore, the optical coupling losses with a single-mode optical fiber are still high. They are about 4.5 dB.

The present invention makes it possible to resolve the problems related to the prior art components. For this purpose, it proposes an optical component comprising an integrated spot-size converter wherein two waveguides, one active and one passive, are superimposed and each of them has a particular configuration to provide for a high-quality mode adaptation. The matching of the optical mode in the component according to the invention is done chiefly in the passive waveguide.

SUMMARY OF THE INVENTION

The invention relates more particularly to a semiconductor optical component, comprising an active waveguide and a passive waveguide that are superimposed and buried in a sheathing layer, wherein the component comprises successively:

a damped coupling section in which the width of the active waveguide tapers down and the width of the passive waveguide increases, and a mode expansion section comprising only the passive waveguide whose width tapers down.

According to another characteristic of the invention, the component furthermore comprises a transition section positioned between the damped coupling section and the mode expansion section, in which the width of the active waveguide tapers down to 0 $\mu$m.

According to another characteristic of the invention, the passive guide has a thickness of 100 to 200 nm. The length of the damped coupling section is preferably smaller than or equal to 200 $\mu$m. The length of the transition section ranges from 0 to 100 $\mu$m.

According to another characteristic of the invention, the width of the passive waveguide in the damped coupling section increases up to a value of 2 to 3 $\mu$m.

According to another characteristic of the invention, the width of the passive waveguide section in the transition section may vary and have a discontinuity.

According to another characteristic, the width of the passive waveguide in the mode expansion section tapers down to a value of 0.2 to 0.9 $\mu$m.

According to another characteristic, the width of the active waveguide in the damped coupling section tapers down a value of about 0.3 $\mu$m.

The present invention enables the making of an optical component comprising an integrated spot-size converter, wherein the optical mode is chiefly deconfined in the passive guide so much so that the current threshold and the efficiency of the component are not affected. The passive and active waveguides are not aligned but they are coupled vertically, so much so that the problems related to alignment are prevented. Furthermore, the two types of active and passive waveguide may be optimized separately.

BRIEF DESCRIPTION OF THE DRAWINGS

Other particular features and advantages of the invention shall appear from the following description, given by way of an illustrative example, with reference to the appended drawings, of which.

MORE DETAILED DESCRIPTION

Figure 1A:
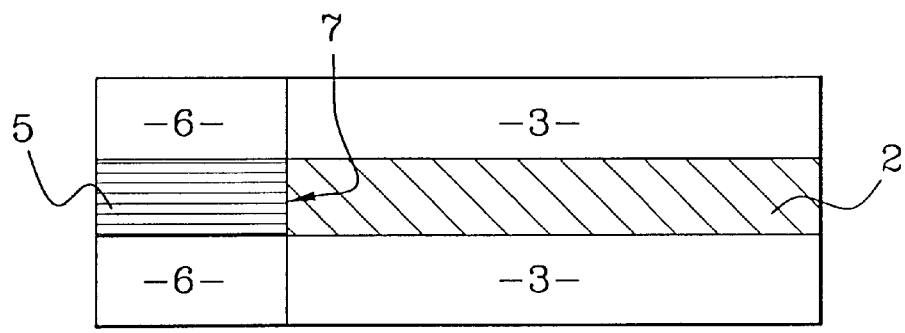
FIGS. 1A and 1B, already described, respectively show a top sectional view and a longitudinal sectional view of a first known embodiment of an optical component comprising an integrated spot-size converter, FIGS. 2A and 2B, already described, respectively show a top sectional view and a longitudinal sectional view of a second known embodiment of an optical component comprising an integrated spot-size converter, FIG. 3, already described, shows a top sectional view of another prior art component comprising an integrated spot-size converter.
Figure 1B:
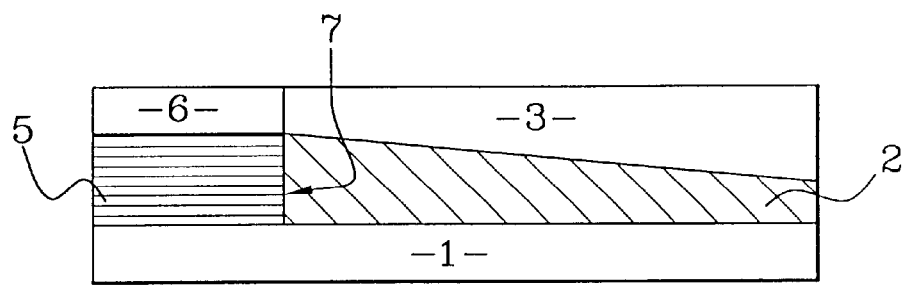
Figure 2A:
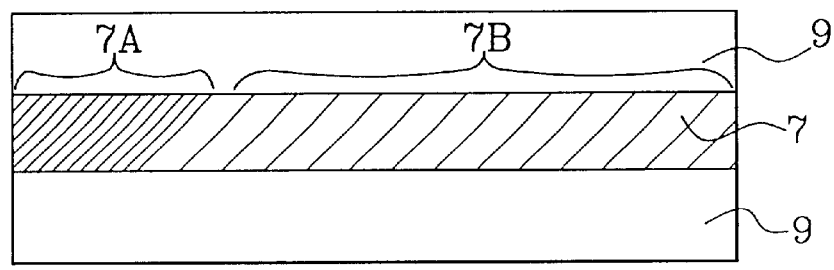
Figure 2B:
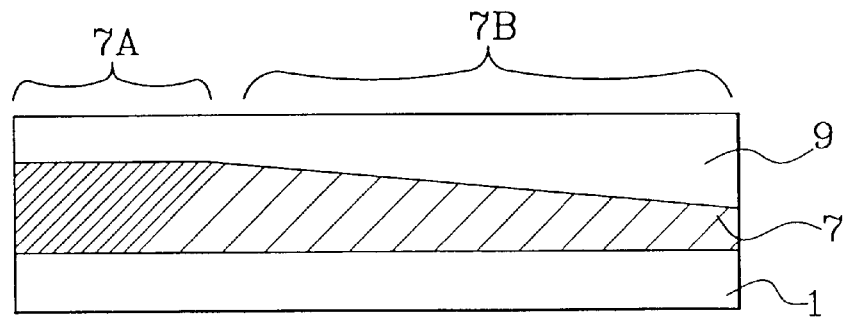
Figure 3:
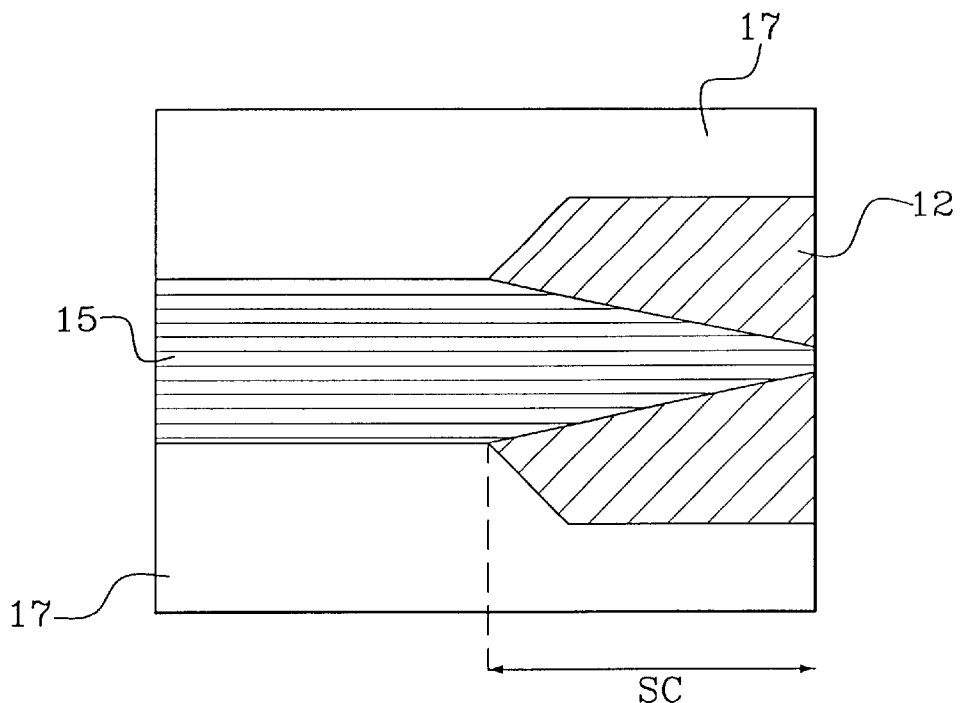
Figure 4:
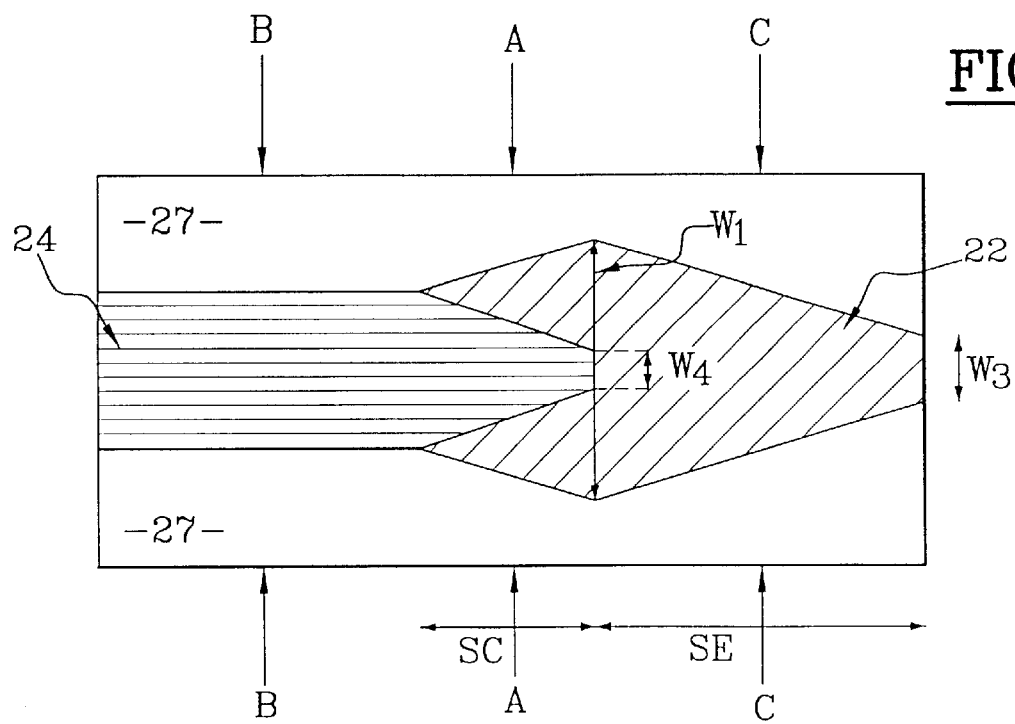
FIG. 4 shows a top sectional view of a component according to a first embodiment of the invention.

An optical semiconductor component according to a first embodiment of the invention is shown schematically in a top view and a sectional view in FIG. 4. This component has an active waveguide 24 and a passive waveguide 22. The two waveguides 24 and 22 are superposed and are furthermore buried in a sheathing layer 27. A damped vertical coupling section, referenced SC in FIG. 4, enables the guided optical mode to be transferred from the active guide 24 to the passive guide 22. In this section SC, the width of the active waveguide 24 tapers down and the width of the passive waveguide increases. The ideal case for transferring an optical mode from an active guide to a passive guide without any optical loss would be that in which an active waveguide is made with a tapering configuration, namely one whose width decreases down to 0 $\mu$m. However, in the technology presently used, there is not yet sufficient mastery over the making of such a tapering configuration and, in general, the width of the waveguide is very well controlled up to a value of 0.3 $\mu$m. Consequently, in the first embodiment, the width of the active waveguide 24 tapers down in the coupling section SC to a value $W_4$ of about 0.3 $\mu$m. This width $W_4$ of 0.3 $\mu$m creates a discontinuity between the two waveguides, namely the active and passive waveguides 24 and 22.

In order that the optical mode may be transferred into the passive guide 22 without excessive optical losses, i.e. in order that the transition of the optical mode from one guide to the other may undergo the least possible disturbance from the discontinuity thus created, the passive guide 22 must have a configuration such that it prevents the active guide 24 from exerting any influence on the optical guiding. For this purpose, the passive guide 22 has a relatively high thickness. Preferably, this thickness ranges from 100 to 200 nm. For example, it is 150 nm. The active guide for its part has a thickness of about 300 nm. Furthermore, in this section SC, the width of the passive guide 22 increases in order to improve the quality of the coupling section.

The optical component furthermore comprises a second section, called a mode expansion section, referenced SE in FIG. 4. This section makes it possible to deconfine the mode. It comprises only a passive guide 22 whose width tapers down in order to enable the widening (namely the deconfinement) of the size of the optical mode. Preferably, the width of the guide tapers down to a value $W_3$ ranging from 0.2 to 0.9 $\mu$m.

The length of this mode expansion section SE is very important because the deconfinement of the optical mode is done chiefly in this passive section. It must therefore be sufficient to enable sufficient deconfinement of the optical mode. Typically, this value ranges from 100 to 500 µm. The length of the damped coupling section SC for its part is preferably smaller than 200 µm. For, there is no improvement in the coupling between the two types of guide for bigger lengths.

FIGS. 5A to 5F illustrate the different steps of a method for the manufacture of this component. Naturally, the method described hereinafter is only an illustrative and the invention is not limited to this particular method. It extends to all methods of manufacture that enable the making of this type of component.

Figure 5A:
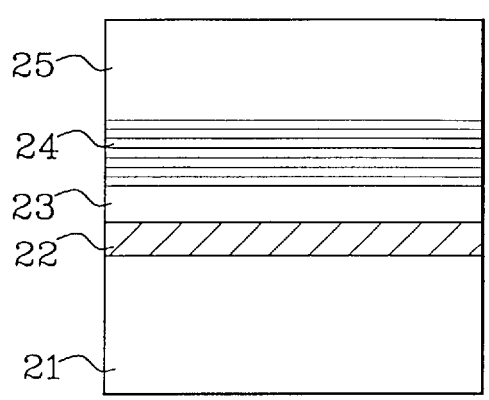
FIGS. 5A to 5F show cross-sectional views of the component of FIG. 4 during different steps of its manufacture, FIGS. 6A and 6B respectively show a top sectional view and a longitudinal sectional view of a component according to a second embodiment of the invention.

A first step of the method, illustrated in the cross-sectional view of FIG. 5A, consists in defining the vertical structure of the component. This vertical structure is dmade on a substrate 21 made of III–V material for example, such as an indium phosphide InP. The stacking of the layers is done according to a standard method of epitaxy, for example according to a molecular beam epitaxy (MBE) method. This stacking comprises, from top to bottom, a first layer 22 made of a quaternary material, for example InGaAsP, designed to form the passive waveguide, a buffer layer 23 made of InP for example, another layer 24 made of a quaternary material with a multiquantum-well structure for example, designed to form the active waveguide, and finally an upper buffer layer 25 made of InP for example.

Figure 5B:
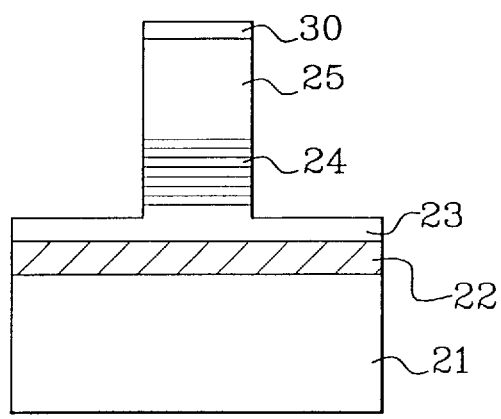
Figure 5C:
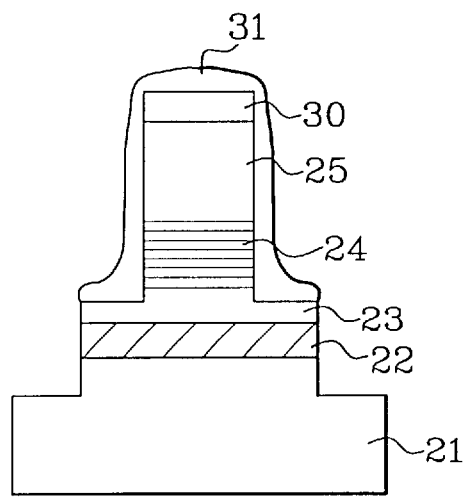
Figure 5D:
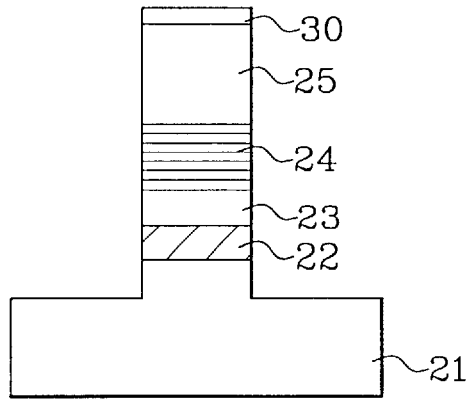

After this vertical structure has been made, it is necessary to define the configuration of the two waveguides 22 and 24. For this purpose, a first operation of lithography is performed. This operation of lithography is designed to define the active waveguide 24 by using a mask 30 made of silica for example (FIG. 5B). The next step consists in defining the passive guide 22. For this purpose, a second operation of lithography is performed by using another mask 31 made of resin for example. FIGS. 5C to 5E show this second operation of lithography. FIG. 5C more specifically shows a cross-sectional view along A—A of FIG. 4 during this second lithography, FIG. 5D represents a cross-sectional view along B—B of FIG. 4 during this second lithography and FIG. 5E shows a cross-sectional view along C—C of FIG. 4.

Figure 5F:
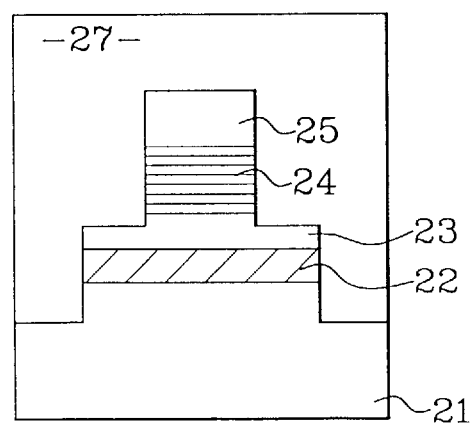
Figure 5E:
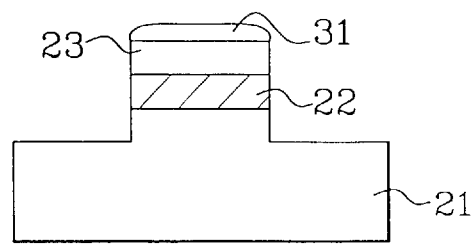

A final step of the method, shown in FIG. 5F, then consists in eliminating the masks 30 and 31 according to a method known to those skilled in the art and then carrying out an epitaxial regrowth to bury the waveguides 22 and 24 thus configured in a sheathing layer 27 made of InP for example. FIG. 5F more particularly shows the case where the waveguide stripe made is a buried ridge stripe. In this case, the substrate 21 is doped with carriers of a first type (n type carriers for example) while the sheathing layer 27 is doped with carriers of a second type (p type carriers in the example). This case however is only an example and of course the invention is not limited to this type of structure. Thus, in other examples, it is also possible to carry out the resumption of epitaxy of structures known as pnBH or SIBH structures well known to those skilled in the art, respectively comprising blocking lateral layers or semi-insulating lateral layers.

Figure 6A:
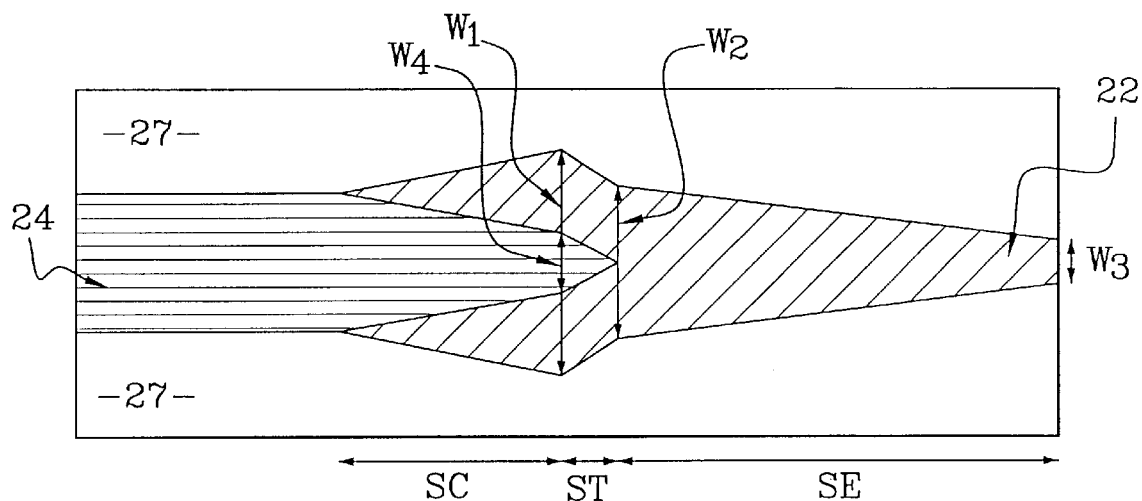
Figure 6B:
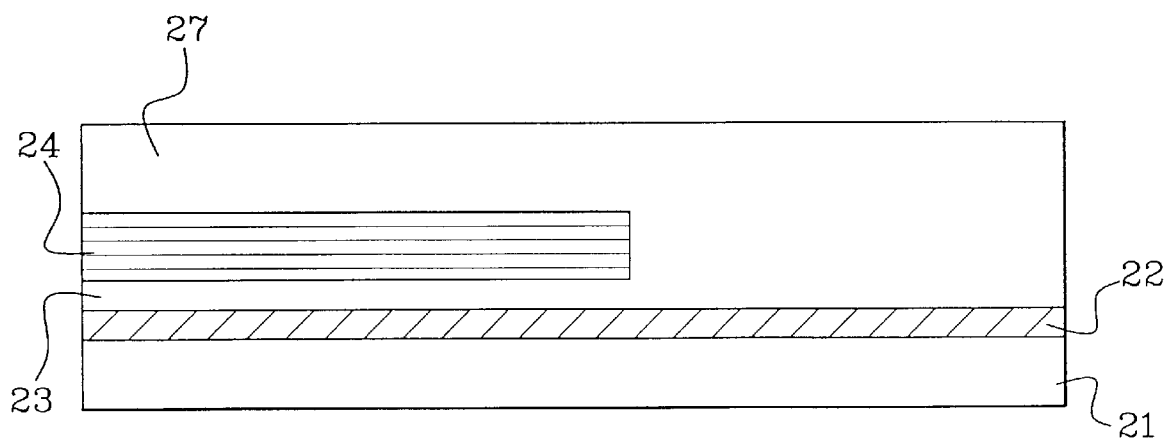

FIGS. 6A and 6B respectively show a top sectional view and a longitudinal sectional view of an optical component according to a second embodiment of the invention. In this embodiment, the component comprises a third section, called a transition section ST, positioned between the damped coupling section SC and the mode expansion section SE. In this transition section ST, the width of the active waveguide 24 tapers down very rapidly up to 0 µm (which is the ideal value) or a value very close to 0 µm, for example 0.1 µm.

This section ST is not essential to the working of the component and to the spot-size conversion or matching of the optical mode, but it provides an improvement in the coupling between the two types of active guides, namely the active guide 24 and the passive guide 22. This is because, in this case, the discontinuity between the active guide 22 and the passive guide 24 is considerably reduced or even eliminated in the ideal case where the width of the guide tapers down to 0 µm. The length of this section ST preferably ranges from 0 to 10 µm.

Furthermore, in this transition section ST, the width of the passive guide 22 may possibly have a discontinuity. In fact, the width of the passive guide may vary throughout the length of this section ST, in the sense of an increase sense or else in the sense of a reduction, depending on the structure of the active waveguide.

In the example of FIG. 6A, the width of the passive waveguide 22 decreases in this section ST. This variation in the width of the passive guide in the transition section ST also enables an improvement in the optical coupling between the two types of guide. The width of the passive guide 22 therefore varies from a value $W_1$ to a value $W_2$. These two values are of the same magnitude and are in the range of 2 µm to 3 µm. In any case, the width of the passive guide 22 is preferably smaller than 3 µm because, beyond this value, the guiding structure of the component becomes a two-mode structure and is no longer a single-mode structure. Naturally, this limitation relates to the example of the coupling between an optical component such as a laser for example and a single-mode optical fiber. The width of the passive guide 22 tapers gradually all along the mode expansion section SE up to a value $W_3$ ranging from 0.2 to 0.9 µm. This gradual tapering of the width of the passive guide 22 makes it possible to deconfine the optical mode.

The longitudinal sectional view of FIG. 6B shows the active waveguide 24 and the passive waveguide 22 seen along their thickness. The passive guide 22 has a thickness of 100 to 200 nm and the active guide 24 has a thickness of about 300 nm. Their thickness remains constant throughout the component.

By means of the present invention, the two waveguides, namely the active and passive waveguides, are deposited in a single epitaxy step, and the confinement layer (or sheathing layer 27) is then deposited in a second epitaxy step after the guides have been configured. The size of the optical mode at output of the component is entirely determined by the configuration of the passive guide, especially the end of this guide, so much so that this approach is suited to any active waveguide structure whatsoever. The energy is transferred from the active guide to the thick passive guide with a small mode size and the optical mode is chiefly deconfined in the passive guide, so much so that the coupling section can be relatively short, namely shorter than 200 µm. Only the mode expansion section must have a length sufficient to enable efficient deconfinement of the mode. Furthermore, since the passive guide 22 and active guide 24 are well separated, they can be optimized independently and do not necessitate any compromises. Finally, given that the two guides are superimposed and not butt-coupled, there is no problem of alignment and adjustment.

To illustrate the results obtained through the invention, a Fabry-Perot type optical component emitting at the wavelength of 1.3 µm and comprising a spot-size converter in a passive guide configured in the manner described here above was made. The damped coupling section SC was made on a length of 70 µm, the mode expansion section SE was made on a length of 120 µm and the transition section ST was made on a length of 10 µm. The results obtained with this component are satisfactory. The optical coupling losses especially are in the range of 3.2 dB and the size of the optical mode, whose initial diameter is about 2 µm, can be widened up to a diameter of about 9 µm.

What is claimed is:

1. A semiconductor optical component, comprising an active waveguide and a passive waveguide that are superimposed and buried in a sheathing layer, wherein the component comprises successively:
   a damped coupling section in which the width of the active waveguide tapers down and the width of the passive waveguide increases, and
   a mode expansion section comprising only the passive waveguide whose width tapers down.

2. A component according to claim 1, wherein the component furthermore comprises a transition section positioned between the damped coupling section and the mode expansion section, in which the width of the active waveguide tapers down to 0 µm.

3. A component according to one of the claim 1, wherein the passive guide has a thickness of 100 to 200 nm.

4. A component according to one of the claim 1, wherein the length of the damped coupling section is smaller than or equal to 200 µm.

5. A component according to one of the claim 1, wherein the length of the mode expansion section ranges from 100 to 500 µm.

6. A component according to one of the claim 1, wherein the length of the transition section ranges from 0 to 10 µm.

7. A component according to one of the claim 1, wherein the width of the passive waveguide in the damped coupling section increases up to a value of 2 to 3 µm.

8. A component according to claim 1, wherein the width of the passive waveguide section in the transition section may vary and have a discontinuity.

9. A component according to claim 1, wherein the width of the passive waveguide in the mode expansion section tapers down to a value of 0.2 to 0.9 µm.

10. A component according to claim 1, wherein the width of the active waveguide in the damped coupling section tapers down a value of about 0.3 µm.

* * * * *